(12) United States Patent
Li et al.

(10) Patent No.: US 6,573,143 B1
(45) Date of Patent: Jun. 3, 2003

(54) TRENCH TRANSISTOR STRUCTURE AND FORMATION METHOD

(75) Inventors: Wei Ning Li, Singapore (SG); Yung Tao Lin, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/997,324

(22) Filed: Nov. 28, 2001

(51) Int. Cl.$^7$ .............................................. H01L 21/336
(52) U.S. Cl. ........................................ 438/270; 438/282
(58) Field of Search ................................ 438/270, 272, 438/277, 282, 407, 424, FOR 188

(56) References Cited

U.S. PATENT DOCUMENTS 6,171,914 B1 * 1/2001 Liao et al. ................... 438/302
2001/0039092 A1 * 11/2001 Morimoto et al. .......... 438/270

FOREIGN PATENT DOCUMENTS

JP          11-154749      *    6/1999

* cited by examiner

Primary Examiner—George Fourson
Assistant Examiner—Thanh V Pham
(74) Attorney, Agent, or Firm—Wagner, Murabito & Hao LLP

(57) ABSTRACT

A trench transistor formation method for creating source and drain regions and source and drain extension regions having an idealized doping profile using a single dopant implantation step. In one embodiment, the present invention is comprised of a method which includes forming a trench having sidewalls and a bottom into a substrate. The present embodiment also recites forming sidewalls spacer regions along at least a portion of the sidewalls of the trench. Subsequently, the present embodiment forms a gate dielectric along at least a portion of the bottom of the trench, and deposits a gate metal within the trench. The present embodiment then subjects the substrate to an etching process such that the top surface of the substrate is lower than the top surface of the sidewall spacer regions formed along the sidewalls of the trench. The present embodiment then performs a single dopant implantation step which results in the formation of both the source and drain regions and the source and drain extension regions wherein the source and drain regions have an implantation depth which is greater than the implantation depth of the source and drain extension regions. Additionally, substantially no dopant is implanted within a channel region residing beneath the gate metal disposed within the trench. In so doing, an idealized dopant profile is achieved within the trench transistor using the single dopant implantation step.

16 Claims, 11 Drawing Sheets

TRENCH TRANSISTOR STRUCTURE AND FORMATION METHOD

FIELD OF THE INVENTION

The present claimed invention relates to the field of semiconductor processing. More particularly, the present claimed invention relates to a method for forming a trench transistor.

BACKGROUND ART

As semiconductor geometries continue to become smaller and smaller, new approaches arise in the fabrication of the semiconductor devices. One such example is found in "trench transistors". In a trench transistor, a gate is formed within a trench formed into a substrate. In such trench transistors, as with more conventional transistors, it is desired to create a doping profile which achieves a desired characteristic. Unfortunately, such a doping profile is not easily achieved in a trench transistor.

Specifically, in order to achieve a desired doping profile in a trench transistor, multiple pocket implantations are commonly required. Such multiple pocket implantations are complex and significantly increase the fabrication cost associated with trench transistors. Furthermore, the requirement for multiple pocket implantations increases the number of process steps required to form a trench transistor. As a result, the multiple pocket implantations associated with conventionally fabricated trench transistors reduce throughput, increase cost, decrease yield, and degrade the reliability of the trench transistor formation process.

As yet another drawback, trench transistors, which form the gate in a trench within the substrate, also suffer from deleterious gate to source and/or gate to drain electrical shorting. That is, by forming the gate in a trench in the substrate, instead of as a raised structure residing above the substrate, trench transistors are prone to the aforementioned shorting.

Thus, a need exists for a method to form a trench transistor having an idealized doping profile. Still another need exists for a method which meets the above need and which forms a trench transistor without the complexity and increased cost associated with the multiple pocket implantations conventionally required to form the source and drain regions and the source and drain extension regions. Still another need exists for a method which meets the above needs and which minimizes deleterious gate to source or gate to drain shorts.

SUMMARY OF INVENTION

The present invention provides a method for forming a trench transistor having an idealized doping profile. The present invention further provides a method which achieves the above accomplishment and which forms a trench transistor without the complexity and increased cost associated with the multiple pocket implantations conventionally required to form the source and drain regions and the source and drain extension regions. The present invention also provides a method which achieves the above accomplishments and which minimizes deleterious gate to source or gate to drain shorts.

In one embodiment, the present invention is comprised of a method which includes forming a trench having sidewalls and a bottom into a substrate. The present embodiment also recites forming sidewalls spacer regions along at least a portion of the sidewalls of the trench. Subsequently, the present embodiment forms a gate dielectric along at least a portion of the bottom of the trench, and deposits a gate metal within the trench. The present embodiment then subjects the substrate to an etching process such that the top surface of the substrate is lower than the top surface of the sidewall spacer regions formed along the sidewalls of the trench. The present embodiment then performs a single dopant implantation step which results in the formation of both the source and drain regions and the source and drain extension regions wherein the source and drain regions have an implantation depth which is greater than the implantation depth of the source and drain extension regions. Additionally, substantially no dopant is implanted within a channel region residing beneath the gate metal disposed within the trench. In so doing, an idealized dopant profile is achieved within the trench transistor using the single dopant implantation step.

In yet another embodiment, the present invention includes the steps of the above-described embodiment and further comprises depositing a layer of metal above the semiconductor substrate, and subjecting the layer of metal to an annealing process to form silicided regions within the substrate above at least a portion of the source and drain regions and proximate to the gate metal disposed within the trench. In so doing, a low resistance contact to the source and drain regions is formed.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
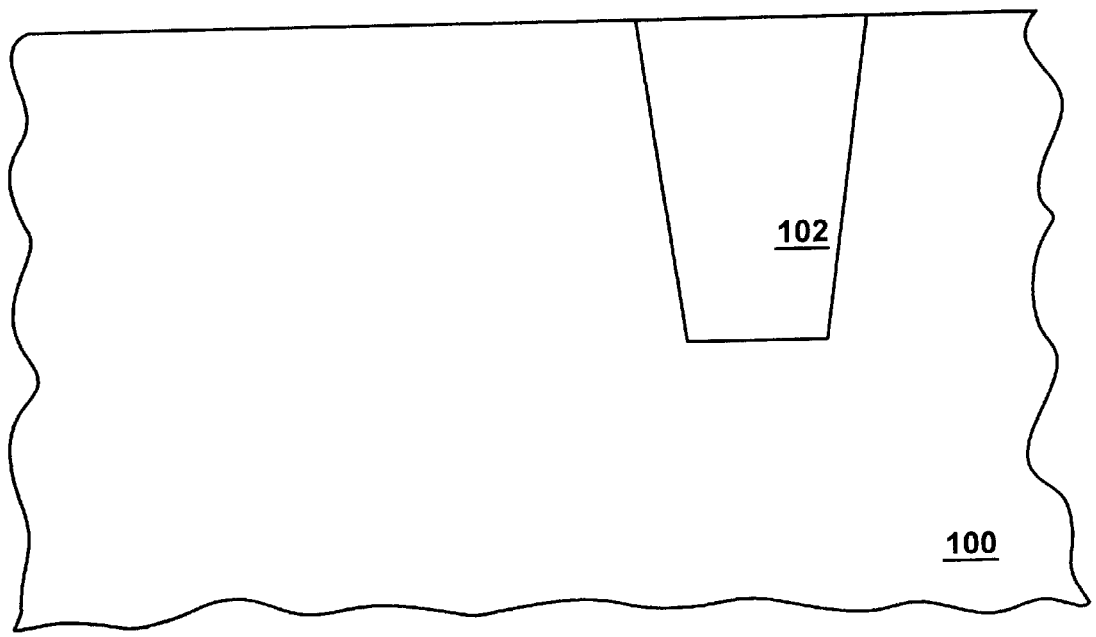
FIG. 1A is a side sectional view of a substrate, including metal layers, into which a via is to be formed in accordance with one embodiment of the present claimed invention.
Figure 1B:
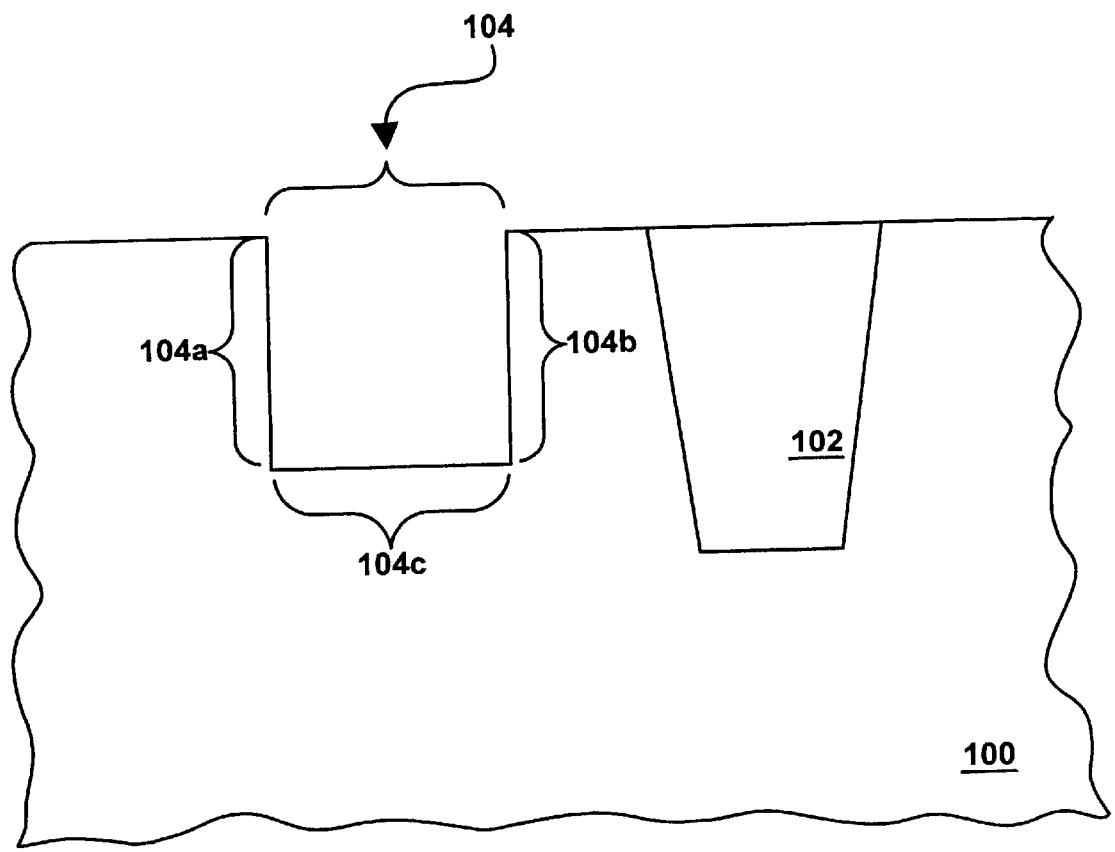
FIG. 1B is a side sectional view of the structure of FIG. 1A having a via formed therein in accordance with one embodiment of the present claimed invention.
Figure 1C:
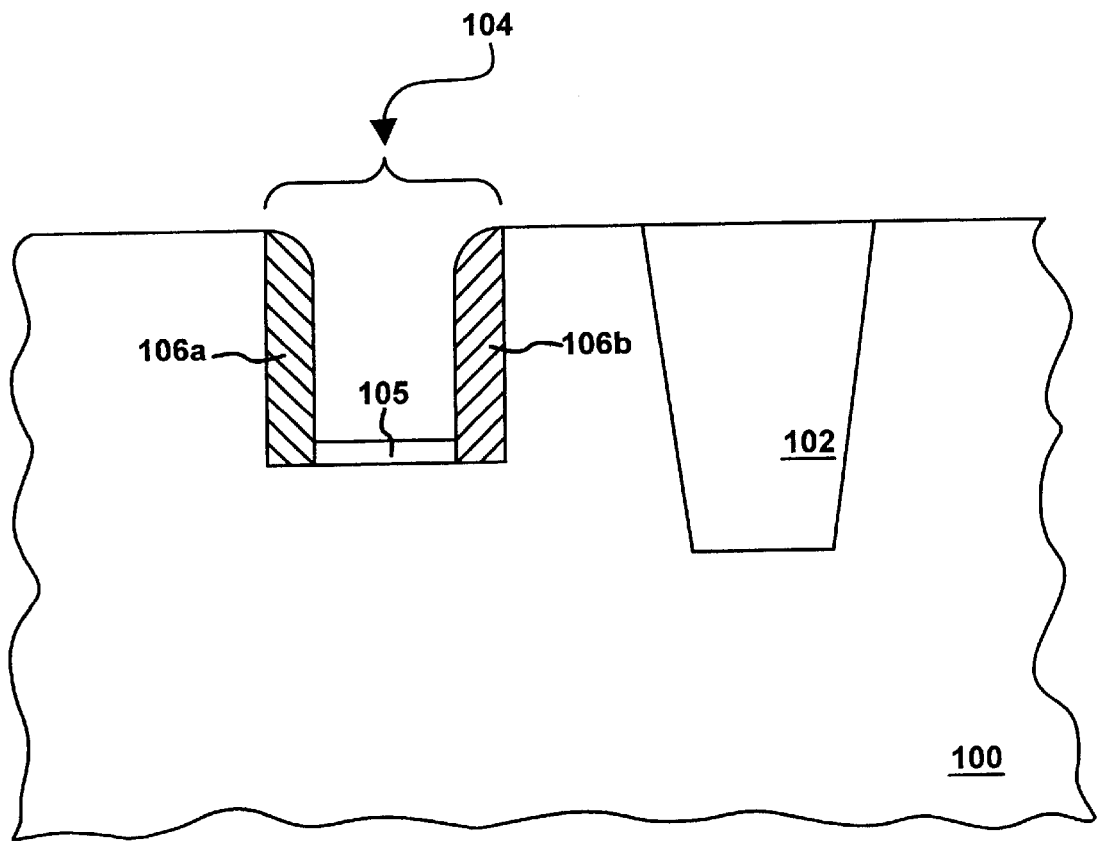
FIG. 1C is a side sectional view of the structure of FIG. 1B wherein a liner material is disposed within the via in accordance with one embodiment of the present claimed invention.
Figure 1D:
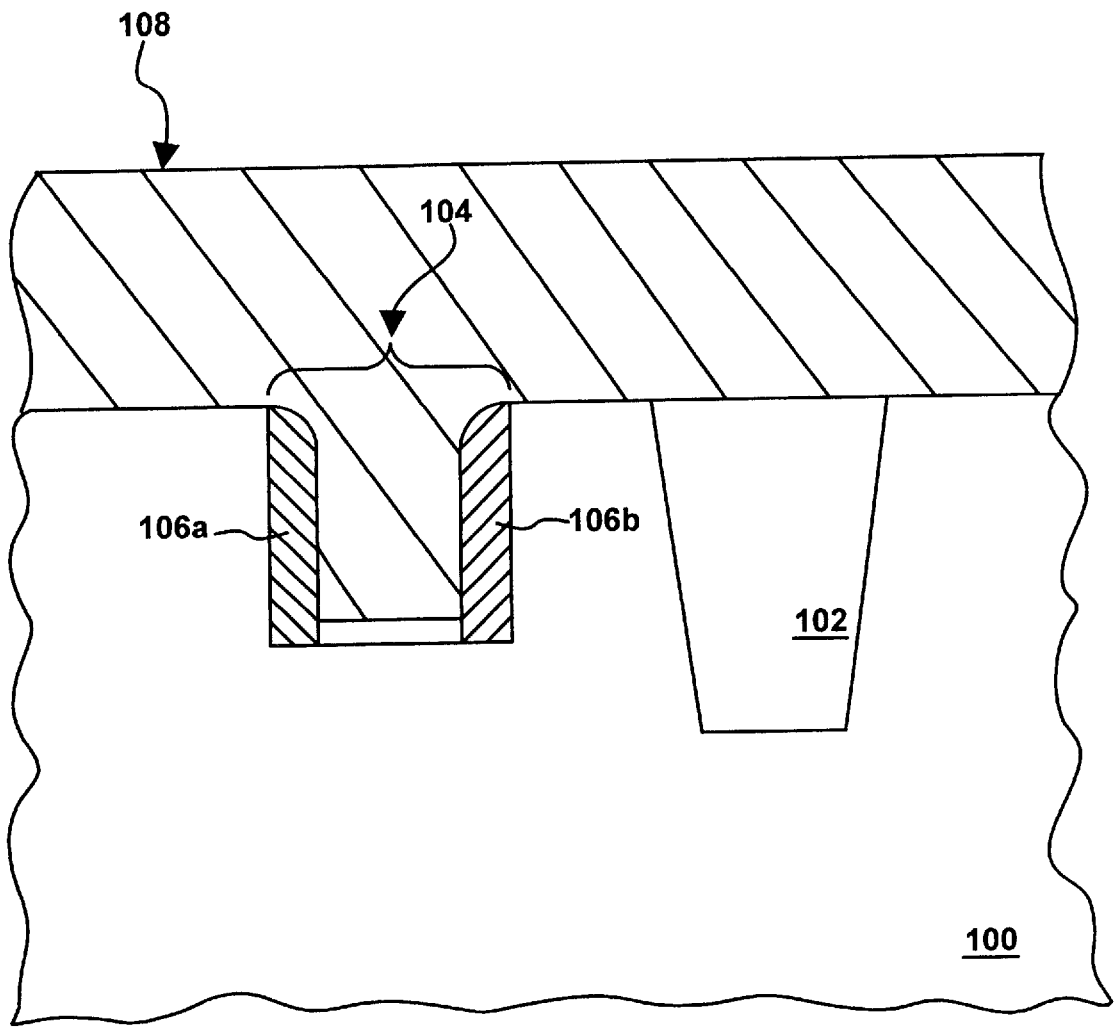
FIG. 1D is a side sectional view of the structure of FIG. 1C wherein the liner material has been subjected to an etching process in accordance with one embodiment of the present claimed invention.
Figure 1E:
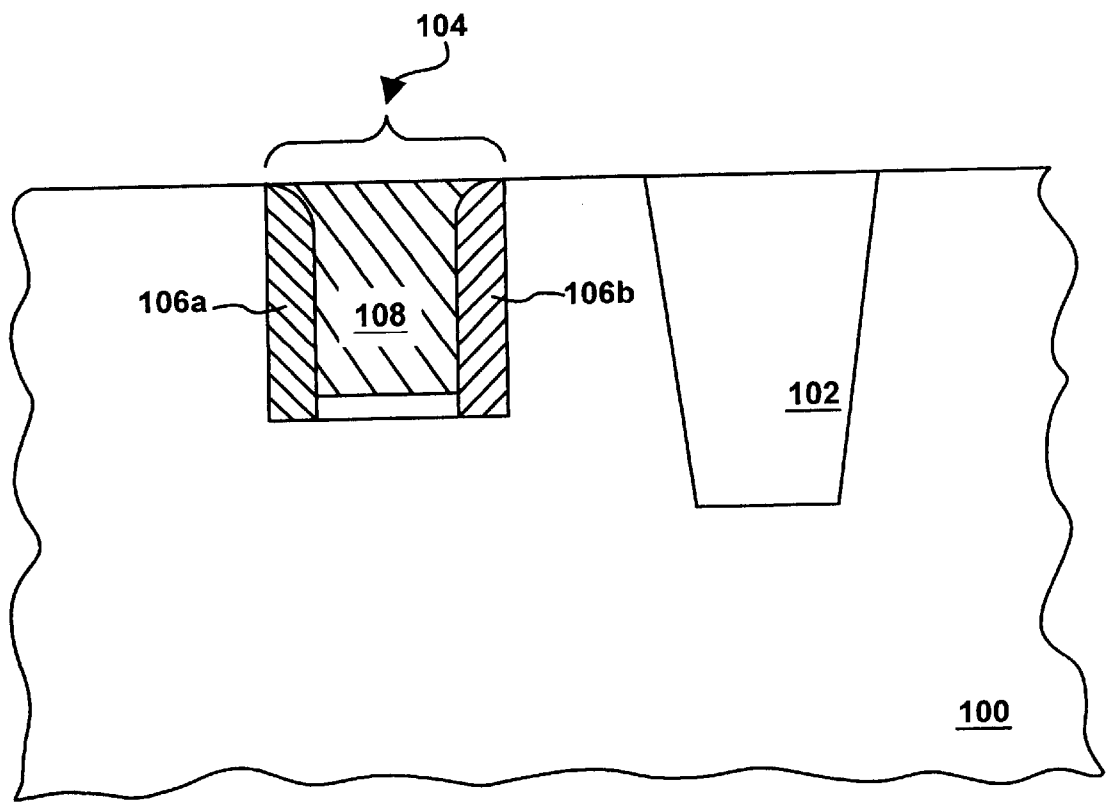
FIG. 1E is a side sectional view of the structure of FIG. 1D wherein a conductive material is disposed with the lined via in accordance with one embodiment of the present claimed invention.
Figure 1F:
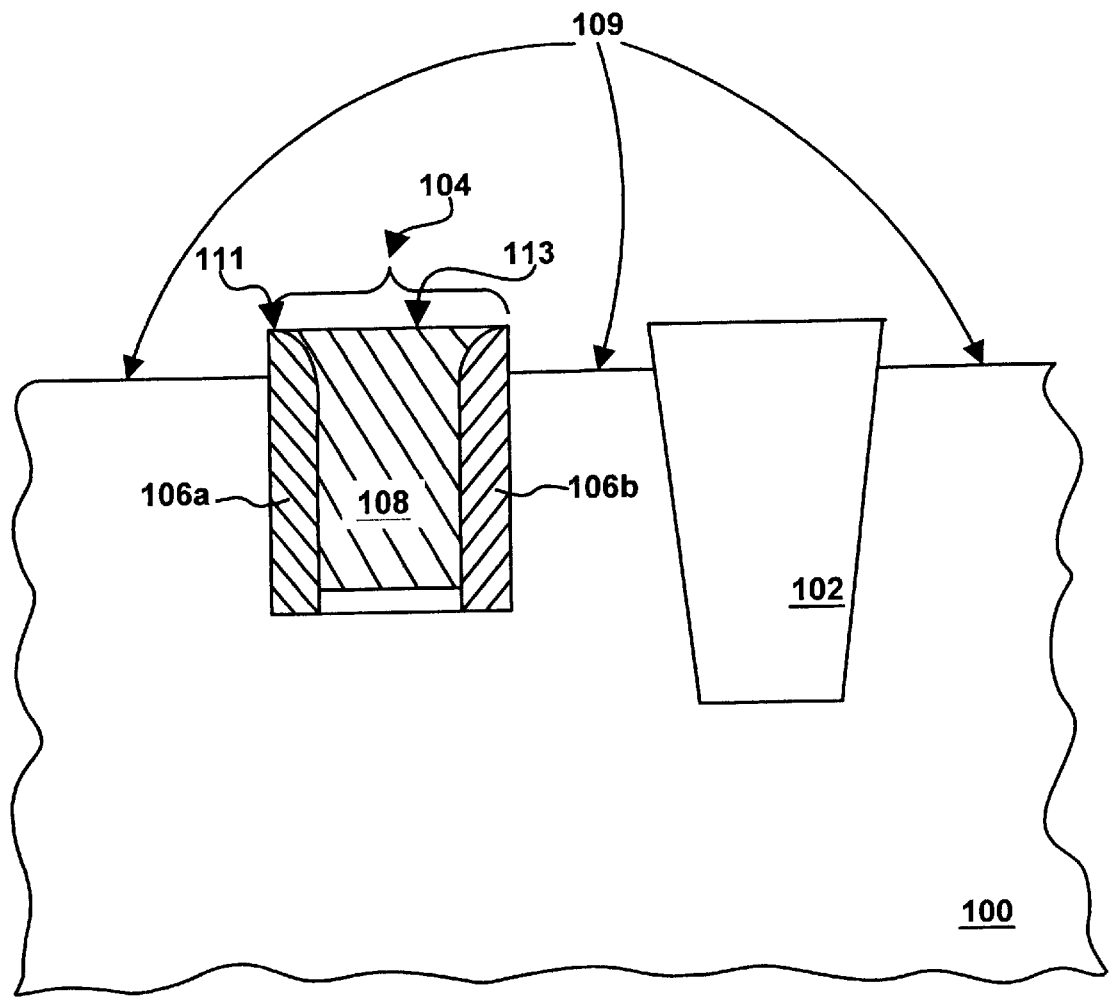
FIG. 1F is a side sectional view of the structure of FIG. 1E wherein the conductive material has been subjected to a planarization process in accordance with one embodiment of the present claimed invention.
Figure 1G:
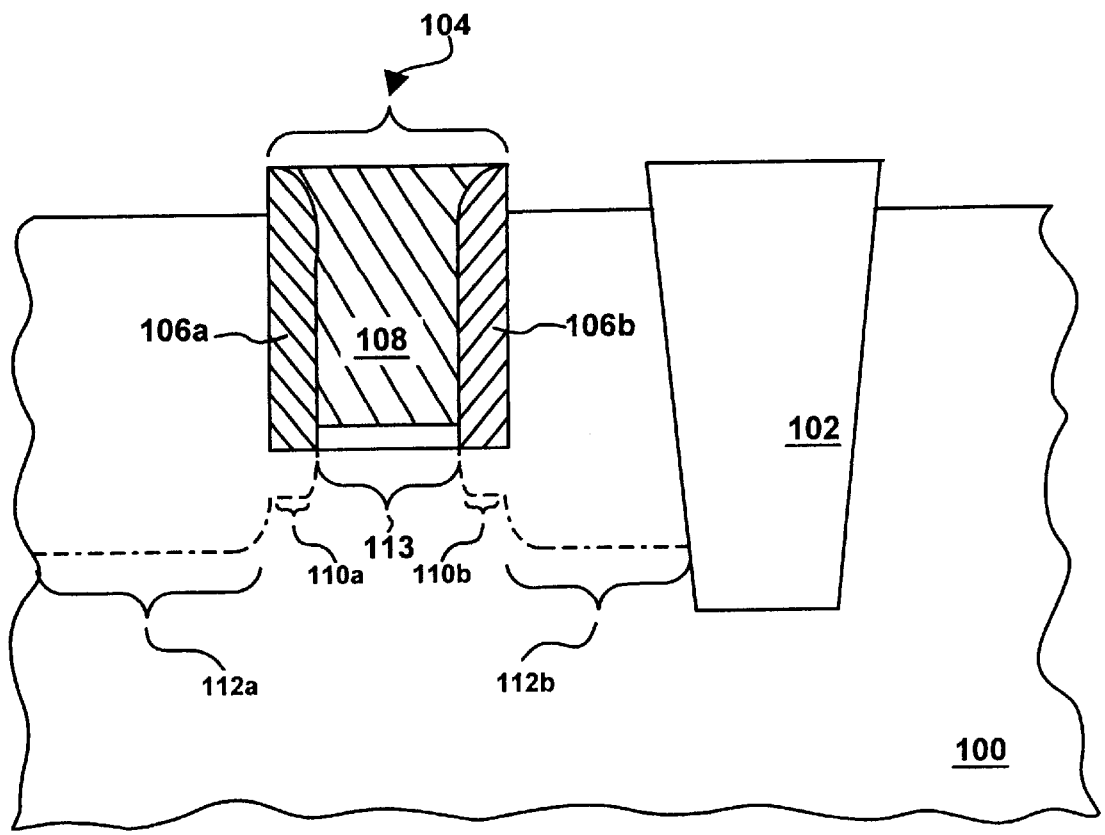
FIG. 1G is a side sectional view of the structure of FIG. 1F wherein the conductive material has been subjected to a planarization process in accordance with one embodiment of the present claimed invention.
Figure 1H:
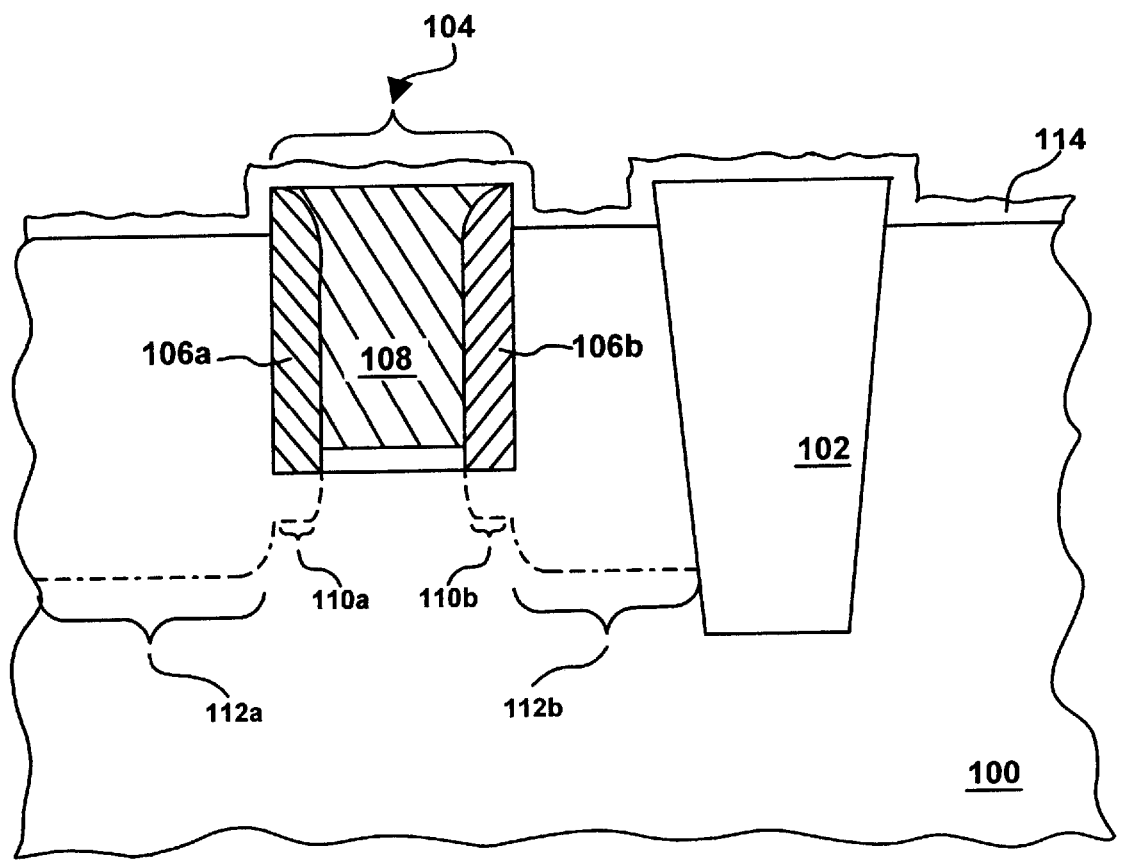
FIG. 1H is a side sectional view of the structure of FIG. 1G wherein the conductive material has been subjected to a planarization process in accordance with one embodiment of the present claimed invention.
Figure 1:
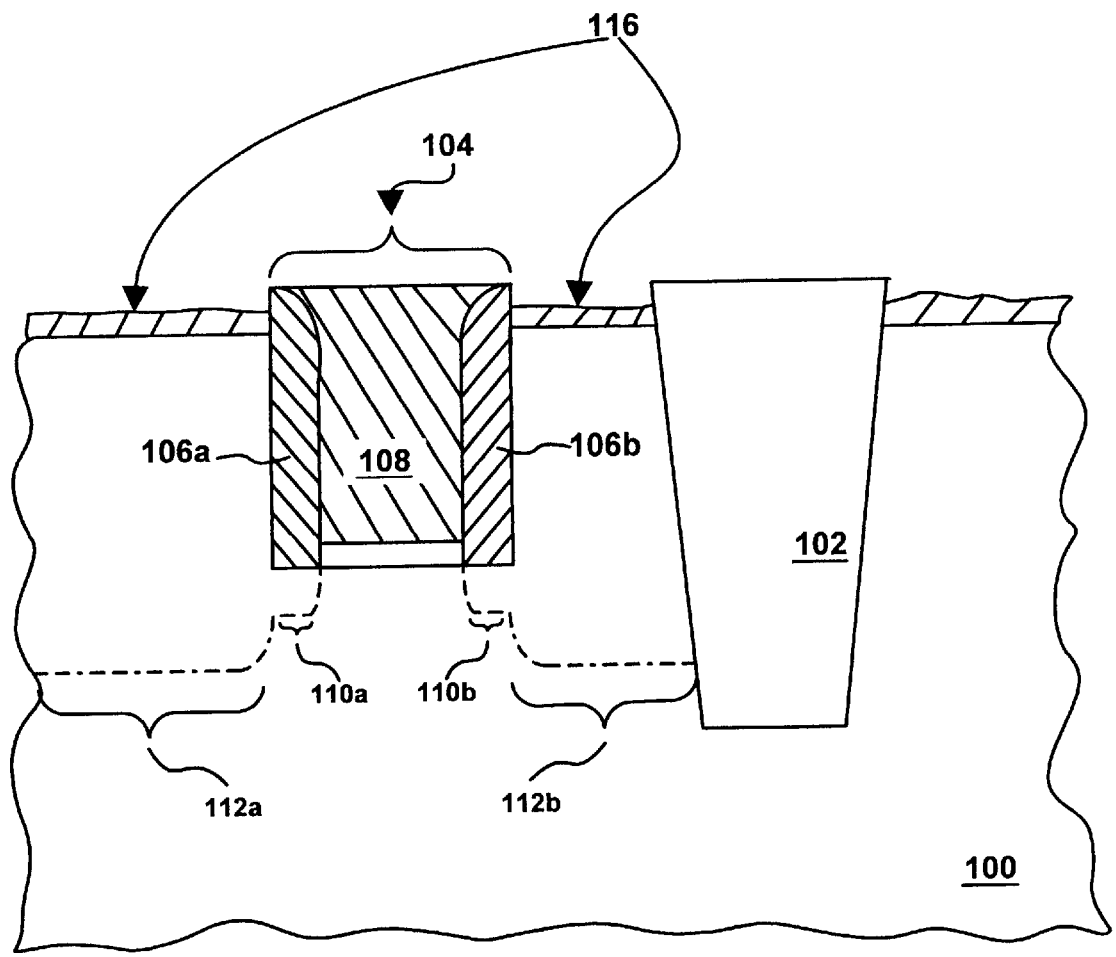
FIG. 1I is a side sectional view of the structure of FIG. 1H wherein the conductive material has been subjected to a planarization process in accordance with one embodiment of the present claimed invention.
Figure 2:
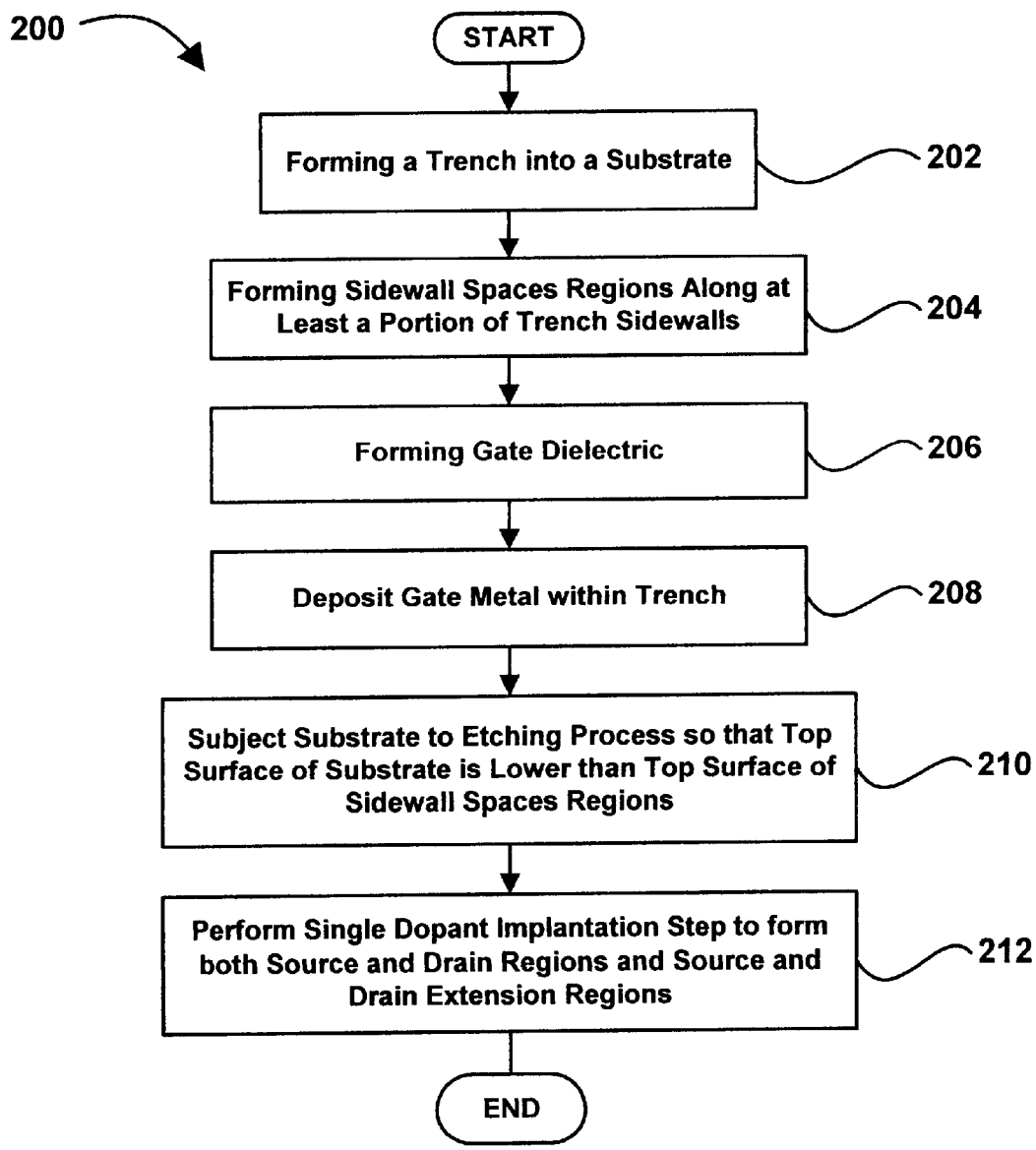
FIG. 2 is a flow chart of steps performed in accordance with one embodiment of the present claimed invention.
Figure 3:
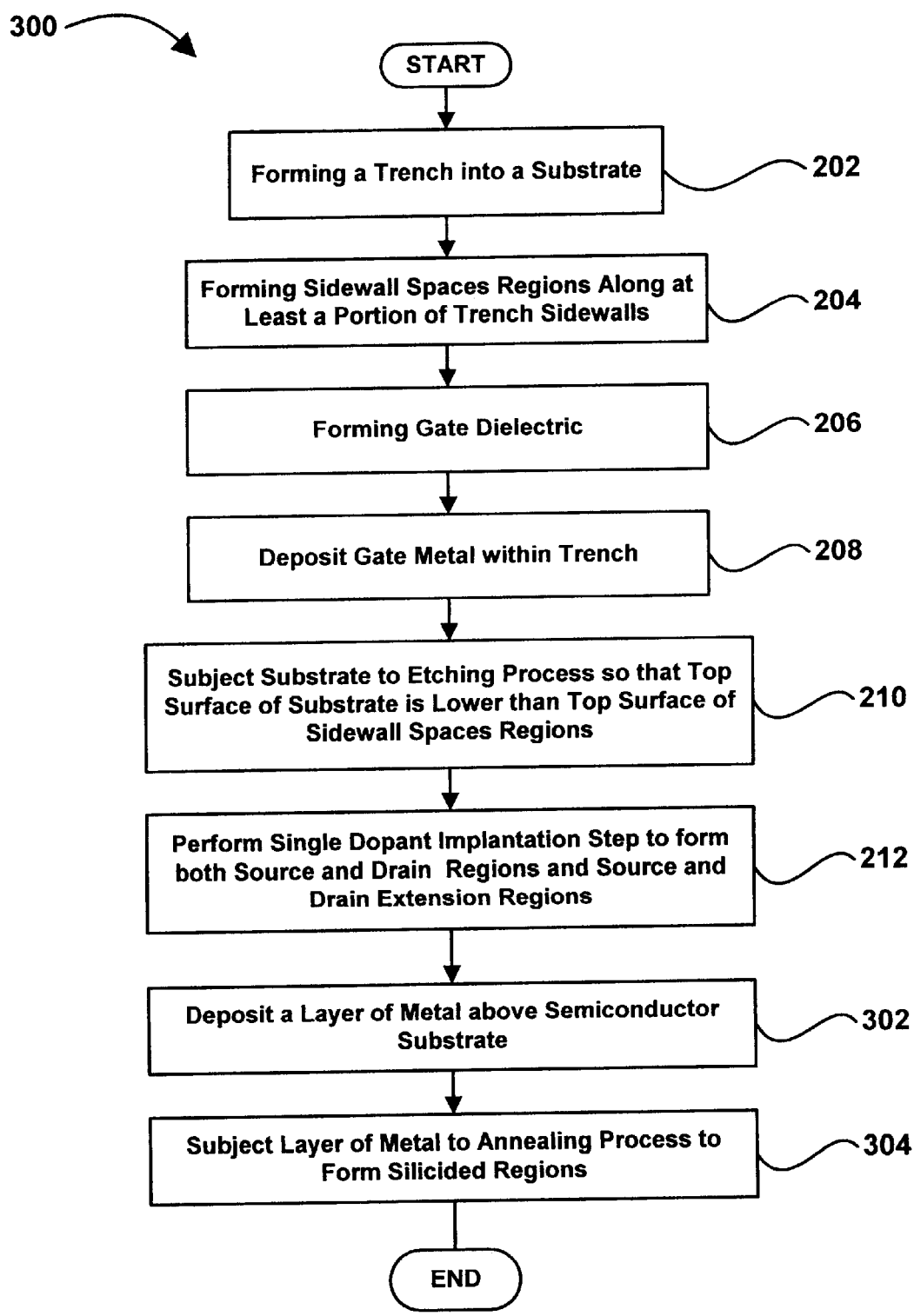
FIG. 3 is a flow chart of steps performed in accordance with another embodiment of the present claimed invention.

FIGS. 1A–1I provide side sectional views of the structure created according to embodiments of the method of the present invention as set forth in the flow charts of FIGS. 2 and 3. For purposes of clarity, the following discussion will utilize the side sectional views of FIGS. 1A–1I in conjunction with the flow charts of FIGS. 2 and 3 to clearly describe the embodiments of the present invention. Flow chart 200 of FIG. 2 begins with step 202. At step 202, the present embodiment forms an opening into a substrate such as, for example, a silicon substrate. As will be described in detail below, the trench transistor to be formed in accordance with the present embodiment will achieve an idealized profile using only a single dopant implantation step. Unlike some conventional trench transistors, the trench transistor formed in accordance with the present invention will not require complex and costly multiple pocket implantations.

Referring still to step 202 of FIG. 2, in the present embodiment, substrate 100 as shown in FIG. 1A has a shallow trench isolation (STI) structure 102 formed therein. Additionally, in the present embodiment, STI structure 102 is formed having a slightly greater depth (e.g. a total depth of approximately 4000–6000 Angstroms) than is typically found in STI regions which are used to isolate conventional devices. More specifically, portions (e.g. gate portions) of a trench transistor typically extend a greater distance into the underlying substrate than would a typical transistor. As a result, STI structure 102, used to provide isolation for at least one trench transistor, must be formed to the aforementioned greater depth in order to provide adequate isolation for the trench transistor. Although such a greater depth is recited for the STI structure in the present embodiment, the present invention is well suited to the use with STI structures which are not formed to such a greater depth.

With reference still to step 202, FIG. 1B shows a trench 104 which has been formed into substrate 100 in accordance with one embodiment of the present claimed invention. In one embodiment of the present invention, trench 104 is formed concurrently with the formation of an opening required to form STI structure 102. As shown in FIG. 1B, trench 104 includes sidewalls portions, typically shown as 104a and 104b, and a bottom 104c.

With reference next to step 204, and as shown in FIG. 1C, the present embodiment forms sidewall spacer regions, typically shown as 106a and 106b, along at least a portion of sidewalls 104a and 104b, respectively. In one embodiment, sidewall spacer regions 106a and 106b are formed by depositing a conformal layer of a dielectric material (e.g. silicon dioxide, silicon nitride, and the like) above substrate 100 and into trench 104. In such an embodiment, the conformal layer of dielectric material is subjected to an etching process so that it is removed from above substrate 100 and from at least a portion of the bottom 104c of trench 104. Furthermore, the etching process results in the dielectric material remaining primarily along sidewalls 104a and 104b of trench 104.

Referring now to step 206 and with reference still to FIG. 1C, after the formation of sidewall spacer regions 106a and 106b, the present embodiment forms a gate dielectric 105 along at least a portion of the bottom 104c of trench 104. In one embodiment, gate dielectric 105 is formed by exposing the uncovered portion of bottom 104c of trench 104 to an oxidizing environment. Although such a gate dielectric formation method is recited in the present embodiment, the present invention is well suited to various other methods to form gate dielectric 105.

With reference now to step 208, the present embodiment then deposits a gate metal within trench 104. As shown in FIG. 1D, in one embodiment, the deposition of the gate metal within trench 104 is accomplished by first depositing a blanket layer of gate metal 108, such as, for example, tungsten, titanium nitride, and the like, above substrate 100 and into trench 104. Then, as shown in FIG. 1E, the present embodiment substantially removes layer of gate metal 108 from above substrate 100 such that gate metal 108 remains primarily within trench 104. It will be understood, however, that the present invention is well suited to having gate metal 108 formed or deposited using various other methods.

Referring now to step 210 and to FIG. 1F, the present embodiment subjects substrate 100 to an etching process such that the top surface, typically shown as 109, of substrate 100 is lower than the top surface typically shown as 111, of sidewall spacer regions 106a and 106b formed along sidewalls 104a and 104b of trench 104. As shown in FIG. 1F, in one embodiment of the present invention, after substrate 100 has been subjected to the aforementioned etching process, top surface 109 of substrate 100 is also lower than the top surface, typically shown as 113, of gate metal 108. The present invention is, however, well suited to an embodiment in which the top surface of gate metal 108 and the top surface of sidewall spacer regions 106a and 106b are not coplanar.

Additionally, with reference still to step 210 and to FIG. 1F, in one embodiment of the present invention, substrate 100 is subjected to an etching process such that top surface 109 of substrate 100 is approximately 500–1000 Angstroms lower than top surface 111 of sidewall spacer regions 106a and 106b. Although such a difference in depth between top surface 109 of substrate 100 and top surface 111 of sidewall spacer regions 106a and 106b is recited in the present embodiment, the present invention is well suited to having various greater or lesser depth differences between top surface 109 of substrate 100 and top surface 111 of sidewall spacer regions 106a and 106b.

Referring now to step 212, the present embodiment then performs a single dopant implantation step resulting in the formation of both source and drain regions, 112a and 112b, and source and drain extension regions, 110a and 110b. As shown in FIG. 1G, and in accordance with the present invention, source and drain regions 112a and 112b have an implantation depth which is greater than the implantation depth of source and drain extension regions 110a and 110b.

More specifically, as mentioned above in conjunction with step 210, in the present embodiment, substrate 100 is subjected to an etching process such that top surface 109 of substrate 100 is lower than the top surface 111 of sidewall spacer regions 106a and 106b. Due to this difference in height, and due to the difference in the projection range of most major implant species, dopant implanted through sidewall spacer regions 106a and 106b will not project as far into substrate 100 as dopant implanted (at the same energy) through top surface 109 of substrate 100. As a result, at source and drain extension regions 110a and 110b, the dopant is implanted to a first depth. Similarly, at source and drain regions 112a and 112b, the dopant is implanted to a second depth, wherein the second depth is greater than the first depth. Hence, by subjecting substrate 100 to the aforementioned etching process, the present embodiment achieves an idealized doping profile as is shown in FIG. 1G. For purposes of the present application, an idealized doping profile refers to a doping profile in which source and drain extension regions 110a and 110b having a dopant implantation depth which is less than that of source and drain regions 112a and 112b such that a desired "step-like" profile is achieved. Additionally, as shown in FIG. 1G, substantially no dopant is implanted within the channel region 113 residing beneath gate metal 108 disposed within trench 104. That is, in the present embodiment, the projection range of the dopant through the metal of gate metal 108 is short enough to prevent substantial doping of region 113.

Referring still to step 212 and to FIG. 1G, unlike conventional trench transistor formation methods, the present embodiment achieves the above-described idealized doping profile using only a single doping implantation step. As a result, the present invention eliminates the need for complex and costly multiple pocket implantations. Thus, the present invention reduces the number of process steps required to form a trench transistor with the aforementioned idealized profile. Hence, the present invention improves throughput, reduces cost, increases yield, and improves the reliability of trench transistor formation processes.

With reference still to FIG. 1G, the present invention has an additional substantial benefit associated therewith. Namely, step 210 of the present invention prevents the occurrences of gate metal 108 to source region and/or gate metal 108 to drain region shorts. Specifically, by etching top surface 109 of substrate 100, a greater separation distance is created between gate metal 108 and the source and drain regions. Furthermore, sidewall spacer regions 106a and 106b comprise a more substantial physical dielectric barrier between gate metal 108 and the source and drain regions due to the etching process of step 210. Thus, the present invention further improves the reliability of trench transistor formation processes by preventing the occurrence of gate metal 108 to source region and/or gate metal 108 to drain region shorts.

With reference now to FIG. 3, a flow chart 300 is shown of steps performed in accordance with another embodiment of the present claimed invention in which silicided regions are formed above at least a portion of source region 112a and drain region 112b. As shown in flow chart 300, the method of the present embodiment includes the steps and features of the above-described embodiment (i.e. as recited in steps 202–212 of FIG. 2, and shown in FIGS. 1A–1G). For purposes of brevity and clarity, a discussion of these steps is not repeated here. The method of the present embodiment includes an additional steps 302 and 304 which are described below in detail.

At step 302, as illustrated in FIG. 1H, the present embodiment deposits a layer 114 of a conductive material above the structure of FIG. 1G. In one embodiment of the present invention, layer 114 of conductive material is comprised of a conductive metallic layer such as, for example, titanium, cobalt, and the like. Although such conductive materials are recited in the present embodiment, the present embodiment is well suited to the use of any other conductive materials from which it is desired to form a silicided region.

Additionally, as recited in step 304 and as shown in FIG. 1I, the present embodiment completes the formation of silicided regions 116 by subjecting layer 114 of conductive material to an annealing process to form silicided regions 114 within substrate 100 above at least a portion of source region 112a and drain region 112b proximate to gate metal 108. In one embodiment of the present invention, the silicided regions 116 are self-aligned silicided (salicided) regions. Furthermore, although silicided regions 116 are shown extending completely above source region 112a and drain region 112b in FIG. 1I, the present invention is well suited to an embodiment in which silicided regions 116 are formed above only a portion of source region 112a and drain region 112b.

Thus, the present invention provides a method for forming a trench transistor having an idealized doping profile. The present invention further provides a method which achieves the above accomplishment and which forms a trench transistor without the complexity and increased cost associated with the multiple pocket implantations conventionally required to form the source and drain regions and the source and drain extension regions. The present invention also provides a method which achieves the above accomplishments and which minimizes deleterious gate to source or gate to drain shorts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A method for forming a trench transistor, said method comprising the steps of:

a) forming a trench into a substrate, said trench having sidewalls and a bottom;

b) forming sidewalls spacer regions along at least a portion of said sidewalls of said trench;

c) forming a gate dielectric along at least a portion of said bottom of said trench;

d) depositing a gate metal within said trench;

e) subjecting said substrate to an etching process such that the top surface of said substrate is lower than the top surface of said sidewall spacer regions formed along said sidewalls of said trench; and f) performing a single dopant implantation step resulting in the formation of both source and drain regions and source and drain extension regions.

2. The method for forming a trench transistor as recited in claim 1 wherein said step d) comprises:

d1) depositing a layer of said gate metal above said substrate and into said trench; and d2) substantially removing said layer of said gate metal from above said substrate such that said gate metal remains within said trench.

3. The method for forming a trench transistor as recited in claim 1 wherein said step e) comprises:

subjecting said substrate to said etching process such that said top surface of said substrate is approximately 500–1000 Angstroms lower than said top surface said sidewall spacer regions.

4. The method for forming a trench transistor as recited in claim 1 wherein said step f) comprises performing said single dopant implantation step such that said source and drain regions have an implantation depth which is greater than the implantation depth of said source and drain extension regions.

5. The method for forming a trench transistor as recited in claim 1 wherein said step f) comprises performing said single dopant implantation step such substantially no dopant is implanted within a channel region residing beneath said gate metal disposed within said trench.

6. The method for forming a trench transistor as recited in claim 1 further comprising the steps of:

g) depositing a layer of metal above said semiconductor substrate; and h) subjecting said layer of metal to an annealing process to form silicided regions within said substrate above at least a portion of said source and drain regions and proximate to said gate metal disposed within said trench.

7. The method for forming a trench transistor as recited in claim 6 wherein step e) comprises subjecting said substrate to said etching process such that said sidewall spacer regions extend a sufficient distance above said top surface of said substrate to minimize shorting between said gate metal and said silicided regions.

8. A trench transistor formation method for creating source and drain regions and source and drain extension regions having an idealized doping profile using a single dopant implantation step, said trench transistor formation method comprising the steps of:

a) forming a trench into a substrate, said trench having sidewalls and a bottom;

b) forming sidewalls spacer regions along at least a portion of said sidewalls of said trench;

c) forming a gate dielectric along at least a portion of said bottom of said trench;

d) depositing a gate metal within said trench;

e) subjecting said substrate to an etching process such that the top surface of said substrate is lower than the top surface of said sidewall spacer regions formed along said sidewalls of said trench; and f) performing said single dopant implantation step resulting in the formation of both said source and drain regions and said source and drain extension regions wherein said source and drain regions have an implantation depth which is greater than the implantation depth of said source and drain extension regions, and wherein substantially no dopant is implanted within a channel region residing beneath said gate metal disposed within said trench such that an idealized dopant profile is achieved within said trench transistor using said single dopant implantation step.

9. The trench transistor formation method as recited in claim 8 wherein said step d) comprises:

d1) depositing a layer of said gate metal above said substrate and into said trench; and d2) substantially removing said layer of said gate metal from above said substrate such that said gate metal remains within said trench.

10. The trench transistor formation method as recited in claim 8 wherein said step e) comprises:

subjecting said substrate to said etching process such that said top surface of said substrate is approximately 500–1000 Angstroms lower than said top surface said sidewall spacer regions.

11. The trench transistor formation method as recited in claim 8 further comprising the steps of:

g) depositing a layer of metal above said semiconductor substrate; and h) subjecting said layer of metal to an annealing process to form silicided regions within said substrate above at least a portion of said source and drain regions and proximate to said gate metal disposed within said trench.

12. The trench transistor formation as recited in claim 11 wherein step e) comprises subjecting said substrate to said etching process such that said sidewall spacer regions extend a sufficient distance above said top surface of said substrate to minimize shorting between said gate metal and said silicided regions.

13. A trench transistor formation method for creating source and drain regions and source and drain extension regions having an idealized doping profile using a single dopant implantation step, said trench transistor formation method comprising the steps of:

a) forming a trench into a substrate, said trench having sidewalls and a bottom;

b) forming sidewalls spacer regions along at least a portion of said sidewalls of said trench;

c) forming a gate dielectric along at least a portion of said bottom of said trench;

d) depositing a gate metal within said trench;

e) subjecting said substrate to an etching process such that the top surface of said substrate is lower than the top surface of said sidewall spacer regions formed along said sidewalls of said trench;

f) performing said single dopant implantation step resulting in the formation of both said source and drain regions and said source and drain extension regions wherein said source and drain regions have an implantation depth which is greater than the implantation depth of said source and drain extension regions, and wherein substantially no dopant is implanted within a channel region residing beneath said gate metal disposed within said trench such that an idealized dopant profile is achieved within said trench transistor using said single dopant implantation step; and g) depositing a layer of metal above said semiconductor substrate; and h) subjecting said layer of metal to an annealing process to form self-aligned silicided regions within said substrate above at least a portion of said source and drain regions and proximate to said gate metal disposed within said trench.

14. The trench transistor formation method as recited in claim 13 wherein said step d) comprises:

d1) depositing a layer of said gate metal above said substrate and into said trench; and d2) substantially removing said layer of said gate metal from above said substrate such that said gate metal remains within said trench.

15. The trench transistor formation method as recited in claim 13 wherein said step e) comprises:

subjecting said substrate to said etching process such that said top surface of said substrate is approximately 500–1000 Angstroms lower than said top surface said sidewall spacer regions.

16. The trench transistor formation as recited in claim 13 wherein step e) comprises subjecting said substrate to said etching process such that said sidewall spacer regions extend a sufficient distance above said top surface of said substrate to minimize shorting between said gate metal and said self-aligned silicided regions.

* * * * *